US012588202B2

(12) United States Patent
Yang

(10) Patent No.: US 12,588,202 B2
(45) Date of Patent: Mar. 24, 2026

(54) SEMICONDUCTOR DEVICE AND FABRICATION METHOD THEREOF, MEMORY, AND MEMORY SYSTEM

(71) Applicant: YANGTZE MEMORY TECHNOLOGIES CO., LTD., Wuhan (CN)

(72) Inventor: Yonggang Yang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 654 days.

(21) Appl. No.: 18/089,414

(22) Filed: Dec. 27, 2022

(65) Prior Publication Data
US 2024/0164095 A1    May 16, 2024

(30) Foreign Application Priority Data
Nov. 16, 2022    (CN) ......................... 202211436453.X

(51) Int. Cl.
*H10B 43/27*        (2023.01)
*H10B 43/40*        (2023.01)
(52) U.S. Cl.
CPC ............. *H10B 43/27* (2023.02); *H10B 43/40* (2023.02)

(58) Field of Classification Search
CPC ........ H10B 43/27; H10B 43/40; H10B 43/50; H01L 25/18
See application file for complete search history.

(56) References Cited

U.S. PATENT DOCUMENTS 9,397,043 B1 *    7/2016    Minemura ............. H10B 43/10

* cited by examiner

*Primary Examiner* — Marlon T Fletcher
*Assistant Examiner* — Samuel Jonathan Smith
(74) *Attorney, Agent, or Firm* — BAYES PLLC

(57) ABSTRACT

A method of manufacturing a semiconductor device includes providing a stack including interlayer sacrifice layers and interlayer insulation layers stacked alternatively. The stack includes a core region and a periphery region distributed along a first direction. The method also includes forming a gate line slit penetrating the stack and extending along the first direction. The gate line slit includes a first slit and a second slit interconnected with each other. The periphery region includes the first slit. The core region includes the second slit. The width of the first slit along the second direction is greater than the width of the second slit along the second direction. The second direction intersects with the first direction. The method further includes forming an isolation section in at least the first slit.

19 Claims, 12 Drawing Sheets

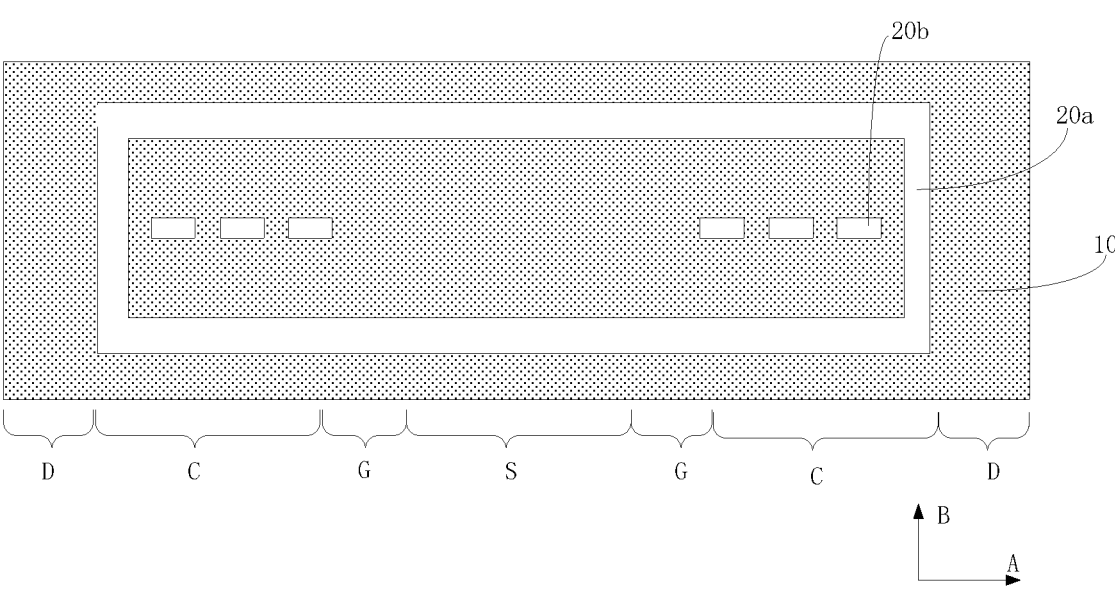

FIG. 1

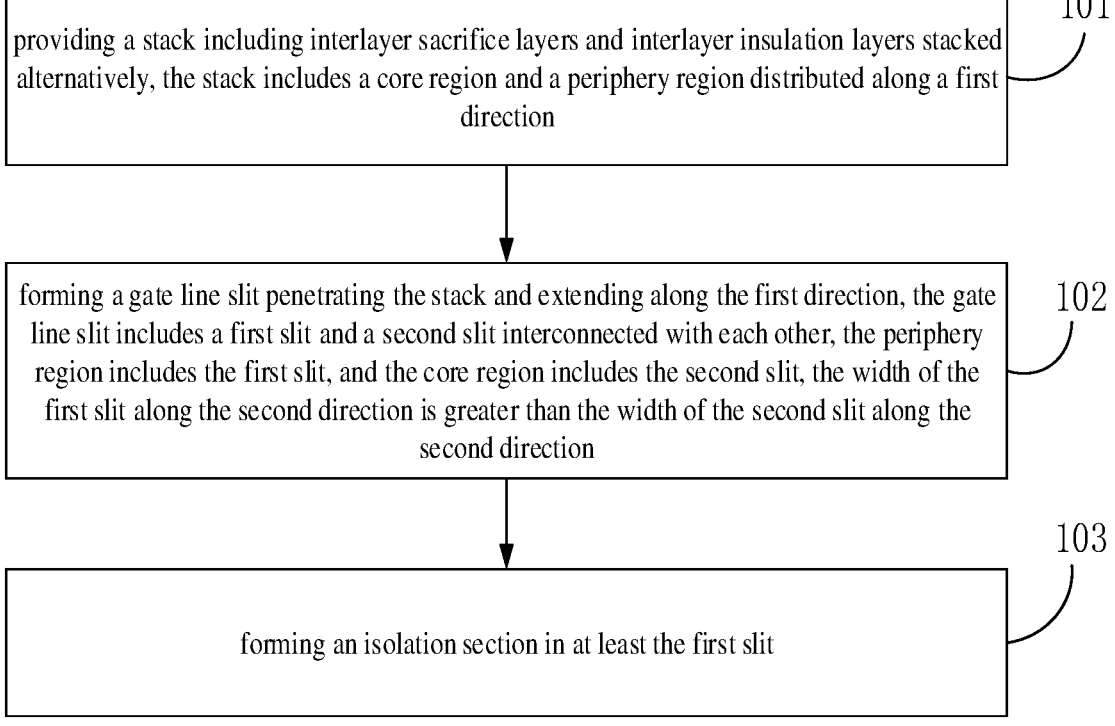

providing a stack including interlayer sacrifice layers and interlayer insulation layers stacked alternatively, the stack includes a core region and a periphery region distributed along a first direction          101 forming a gate line slit penetrating the stack and extending along the first direction, the gate line slit includes a first slit and a second slit interconnected with each other, the periphery region includes the first slit, and the core region includes the second slit, the width of the first slit along the second direction is greater than the width of the second slit along the second direction          102 forming an isolation section in at least the first slit          103

FIG. 2

SEMICONDUCTOR DEVICE AND FABRICATION METHOD THEREOF, MEMORY, AND MEMORY SYSTEM

CROSS-REFERENCE TO RELATED APPLICATIONS

This application claims the benefit of priority to Chinese Application No. 202211436453.X, filed on Nov. 16, 2022, which is incorporated herein by reference in its entirety.

TECHNICAL FIELD

Embodiments of the present application relate to the field of semiconductor technologies, and more particularly to a semiconductor device and a fabrication method thereof, as well as a memory and a memory system.

BACKGROUND

As the number of stacked layers in a memory increases, higher requirements have been proposed for manufacturing process of memories. While manufacturing gate line slits in the memory, instability of memory structure tends to occur.

SUMMARY

The present application provides a semiconductor device and a fabrication method thereof, as well as a memory and a memory system that can improve the structural stability of the semiconductor devices while separating memory blocks.

An embodiment of the present application provides a manufacturing method of a semiconductor device including: providing a stack including interlayer sacrifice layers and interlayer insulation layers stacked alternatively, wherein the stack includes a core region and a periphery region distributed along the first direction; forming a gate line slit penetrating the stack and extending along the first direction, the gate line slit includes a first slit and a second slit interconnected with each other, the periphery region includes the first slit, the core region includes the second slit, the width of the first slit along the second direction is greater than the width of the second slit along the second direction; and forming an isolation section in at least the first slit.

Optionally, the stack further comprises a transition region located on a side of the core region away from the periphery region along the first direction; the gate line slit further comprises a third slit interconnected with the second slit, the transition region comprises the third slit, and a width of the third slit along the second direction is greater than a width of the second slit along the second direction; the step of forming an isolation section in at least the first slit comprises: forming the isolation section at least in the first slit and the third slit.

Optionally, a length of the first slit along the first direction is greater than a length of the third slit along the first direction.

Optionally, the stack further comprises a staircase region located on a side of the transition region away from the core region along the first direction; and the gate line slit further comprises a fourth slit interconnected with the third slit, the staircase region comprises the fourth slit, and a width of the third slit along the second direction is greater than a width of the fourth slit along the second direction.

Optionally, the step of forming the isolation section at least in the first slit and the third slit comprises: etching the interlayer sacrifice layers exposed in the first slit and the third slit to form a first gap interconnected with the second slit and a second gap interconnected with the third slit; and forming the isolation section in the second slit, the first gap, the third slit, and the second gap.

Optionally, the step of forming the isolation section at least in the first slit and the third slit comprises: forming a sacrifice layer on a side of the stack, and the sacrifice layer fills the second slit and the fourth slit and covers the inner surfaces of the first slit and the third slit; removing the sacrifice layer on the side of the stack and the sacrifice layer in the first slit and the third slit; and forming an isolation section on a side of the stack, and the isolation section fills the first slit and the third slit.

Optionally, the method further comprises: providing a base, wherein the stack is located on a side of the base and the gate line slit penetrates the stack and extends into the base; before the step of forming the sacrifice layer, the method further comprises: forming a protection layer at the base exposed in the gate line slit.

Optionally, the step of forming a protection layer at the base exposed in the gate line slit comprises: oxidizing the base exposed in the gate line slit to form the protection layer.

Optionally, the method further comprises: removing the sacrifice layer in the second slit and the fourth slit to replace a portion of the interlayer sacrifice layers with the gate layer via the second slit and the fourth slit, wherein the gate layers are located in the core region, the transition region, and the staircase region.

Optionally, the step of removing the sacrifice layer in the second slit and the fourth slit to replace the portion of the interlayer sacrifice layers with the gate layer via the second slit and the fourth slit comprises: removing the sacrifice layer in the second slit; removing the interlayer sacrifice layers in the core region and the transition region via the second slit to form the third gap interconnected with the second slit; removing the sacrifice layer in the fourth slit; removing the portion of the interlayer sacrifice layers in the staircase region via the fourth slit to form a fourth gap interconnected with the fourth slit; and forming the gate layers in the third gap and the fourth gap.

Optionally, the stack further comprises a transition region located on a side of the core region away from the periphery region along the first direction, and a staircase region located on a side of the transition region away from the core region along the first direction; the second slit extends to the transition region and the staircase region; and the method further comprises: replacing the portion of the interlayer sacrifice layers with the gate layer via the second slit, wherein the gate layers are located in the core region, the transition region, and the staircase region.

Accordingly, an embodiment of the present application further provides a semiconductor device including: a stack structure comprising first material layers and second material layers stacked alternatively, wherein the stack structure comprises a core region and a periphery region distributed along the first direction; and a gate line slit structure penetrating the stack structure and extending along the first direction; wherein the gate line slit structure comprises a first slit structure and a second slit structure connected with each other, the periphery region comprises the first slit structure, the core region comprises the second slit structure, a width of the first slit structure along the second direction is greater than a width of the second slit structure along the second direction, and the second direction intersects with the first direction.

Optionally, the first slit structure comprises an isolation section, and the second slit structure comprises a conductive layer and a spacer layer disposed around the conductive layer.

Optionally, the stack structure further comprises a transition region located on a side of the core region away from the periphery region along the first direction; the gate line slit structure further comprises a third slit structure connected with the second slit structure, the transition region comprises the third slit structure; and a width of the third slit structure along the second direction is greater than a width of the second slit structure along the second direction.

Optionally, the third slit structure comprises the isolation section.

Optionally, a length of the first slit structure along the first direction is greater than a length of the third slit structure along the first direction.

Optionally, the stack structure further comprises a staircase region located on a side of the transition region away from the core region along the first direction; the gate line slit structure further comprises a fourth slit structure connected with the third slit structure, the staircase region comprises the fourth slit structure; and a width of the third slit structure along the second direction is greater than a width of the fourth slit structure along the second direction.

Optionally, the fourth slit structure comprises the conductive layer and the spacer layer.

Optionally, the isolation section further extends to area between the first material layers of the periphery region and the transition region.

Optionally, the stack structure further comprises a transition region located on a side of the core region away from the periphery region along the first direction, and a staircase region located on a side of the transition region away from the core region along the first direction; and the second slit structure extends to the transition region and the staircase region.

Optionally, the second material layers comprise gate layers and interlayer sacrifice layers, the gate layers are located in the core region, the transition region, and the staircase region, and the interlayer sacrifice layers are located in the staircase region and the periphery region.

Accordingly, an embodiment of the present application further provides a memory including: a memory array including the above-described semiconductor device; and a peripheral device bonded with the memory array.

Accordingly, an embodiment of the present application further provides a memory system including: the above-described memory; and a controller electrically connected to the memory.

The present application provides a semiconductor device and a fabrication method thereof, a memory and a memory system, by means of which it is possible to form a gate line slit extending along a first direction, the gate line slit includes a first slit located in the periphery region and a second slit located in the core region, wherein the width of the first slit along the second direction is greater than the width of the second slit along the second direction. An isolation section is formed in the first slit to prevent the interlayer sacrifice layers in the periphery region from being subsequently replaced with the gate layer, thereby achieving separation of the memory blocks and improving the structural stability of the semiconductor device.

BRIEF DESCRIPTION OF THE DRAWINGS

In order to illustrate technical solutions in embodiments of the present disclosure more clearly, drawings needed in the description of the embodiments will be briefly introduced. Apparently, drawings in the following description represent only some embodiments of the present disclosure and, in view of them, other drawings can be figured out by those of ordinary skills in the art without any creative works.

FIG. 1 is a structural diagram of a semiconductor device provided by some embodiments;

FIG. 2 is a flowchart illustrating a method of fabricating a semiconductor device provided by an embodiment of the present application;

DETAILED DESCRIPTION

Figure 3A:
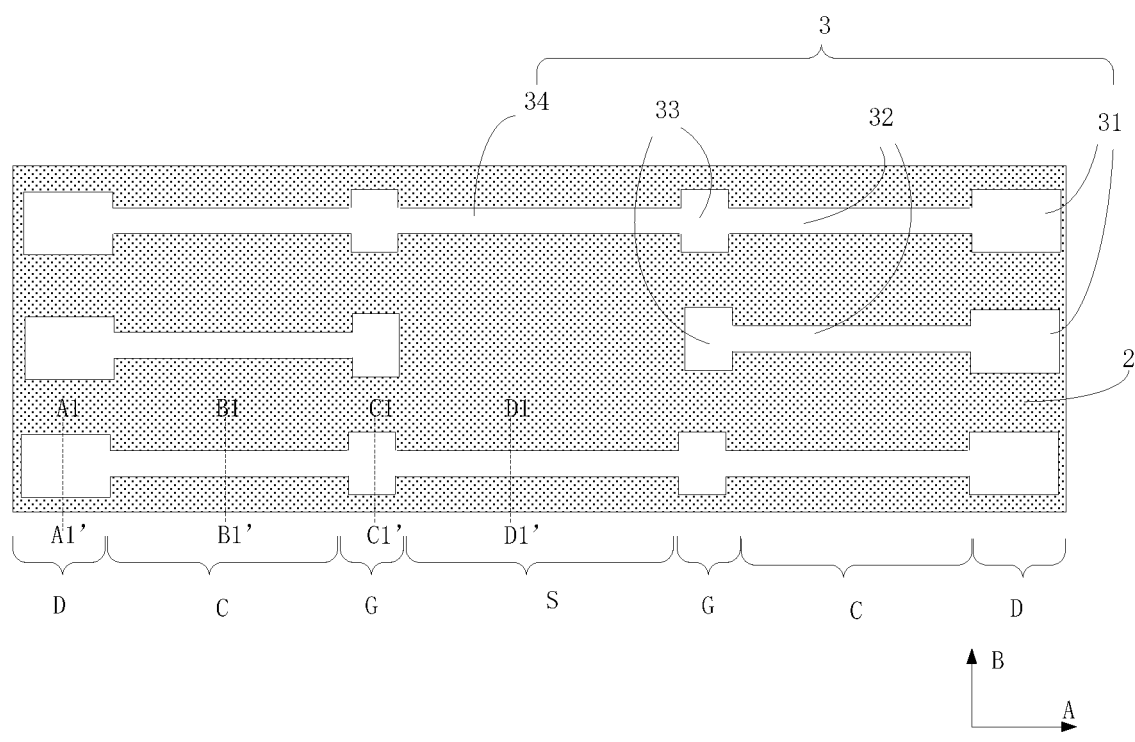
FIGS. 3a-3j are first structural diagrams illustrating a method of fabricating a semiconductor device provided by an embodiment of the present application.

The specific details of structures and functions disclosed herein are only representative and used for the purpose of describing exemplary embodiments of the present application. However, the present application may be practiced in many alternative forms, and should not be construed as being limited to the embodiments described herein.

In the description of the present application, it should be understood that the orientation and position relationships indicated by terms "center," "lateral direction," "upper," "lower," "left," "right," "vertical," "horizontal," "top," "bottom," "inner" and "outer" are orientation and position relationships based on the drawings and only for the purpose of facilitating describing the present application and simplifying the description. There is no indication or implication that the devices or elements referred to must have any particular orientations and positions, or be constructed or operated in any particular orientations and positions. As a result, they should not be understood as a limitation for the present application. Moreover, the terms "first," "second," etc., are only used for the purpose of description and should not be understood to indicate or imply relative importance or to designate the number of the referenced technical features implicitly. Therefore, a feature qualified by "first" or "second" may include one or more instances of the feature explicitly or implicitly. In the description of the present application, "a plurality of" means two or more unless otherwise specified. Moreover, the term "include," "comprise," and variations thereof are intended to cover the meaning of "include or comprise non-exclusively."

In the description of the present application, it is to be noted that the terms "interconnect" and "connect" should be explained broadly, unless otherwise expressly specified and defined. They may be, for example, fixed connection, removable connection or integral connection; mechanical connection or electrical connection; direct interconnection or interconnection with intermediate medium; or inner communication of two elements. The specific meaning of the above-mentioned terms in the present application will be understood by those of ordinary skill in the art depending on specific circumstances.

Terms used herein are only for the purpose of describing specific embodiments without any intention of limiting them. Singular forms such as "a," "an," and "the" are also intended to include plural forms, unless otherwise noted in the context. It is also understood that terms "include" and/or "comprise" used herein designate existence of the stated features, integers, steps operations, elements and/or components without excluding existence or addition of one or more other features, integers, steps, operations, elements, components and/or any combination thereof.

In some embodiments, as shown in FIG. 1, an homocentric rectangular gate line slit 20a is formed in the stack 10. That is, the gate line slit 20a extends along the first direction A and the second direction B and is closed. It is to be noted that if the gate line slit 20a extends only along the first direction A, when replacing the interlayer sacrifice layers in the stack 10 in core region C with the gate layers via the gate line slit 20a, a portion of the interlayer sacrifice layers in a nearby region (namely periphery region D) at both ends of the gate line slit 20a will also be replaced with the gate layers, resulting in electrical connection between core regions C of adjacent memory blocks via the gate layers in the periphery region D. The gate line slit 20a in the present embodiment further extends along the second direction B to form a homocentric rectangular gate line slit such that the core region C is completely isolated in the homocentric rectangular gate line slit 20a to realize separation between memory blocks.

However, the homocentric rectangular gate line slit 20a is an unstable structure that tends to cause inclination or even collapse of the semiconductor device under external stress. In order to improve the structure stability, in some embodiments, the gate line slit in the core region C would be further turned into a plurality of gate line slits 20b spaced apart (equivalent to H-cuts formed by breaking a gate line slit at a plurality of places). However, the fabrication of such gate line slit 20b is difficult.

In addition, when replacing a portion of the interlayer sacrifice layers in the stack 10 with the gate layers via the gate line slit 20a, it is required to fill the sacrifice layer in the gate line slit 20a in the core region C first and remove a portion of the interlayer sacrifice layers in the staircase region S via the gate line slit 20a in the staircase region S. Then, the sacrifice layer is filled in the gate line slit 20a in the staircase region S, and the sacrifice layer in the gate line slit 20a in the core region C is removed to remove all interlayer sacrifice layers in the core region C via the gate line slit 20a in the core region C. While removing the sacrifice layer in the gate line slit 20a in the core region C, the sacrifice layer in the gate line slit 20a in regions nearby the core region C would be etched simultaneously such that the gate line slit 20a with the sacrifice layer removed is not only located in the core region C. While removing the interlayer sacrifice layers in the core region C via this part of gate line slit 20a, it is possible to remove a portion of the interlayer sacrifice layers in the staircase region S. In order to avoid affecting the interlayer sacrifice layers in the staircase region S, the transition region G has a longer length along the first direction A, thereby increasing the volume of the semiconductor device.

Based on this, an embodiment of the present application provides a method of fabricating a semiconductor device.

As shown in FIG. 2, the method of fabricating a semiconductor device provided in an embodiment of the present application includes steps 101 to 103 as described in detail below.

Step 101, providing a stack including interlayer sacrifice layers and interlayer insulation layers stacked alternatively, wherein the stack includes a core region and a periphery region distributed along a first direction.

Figure 3B:
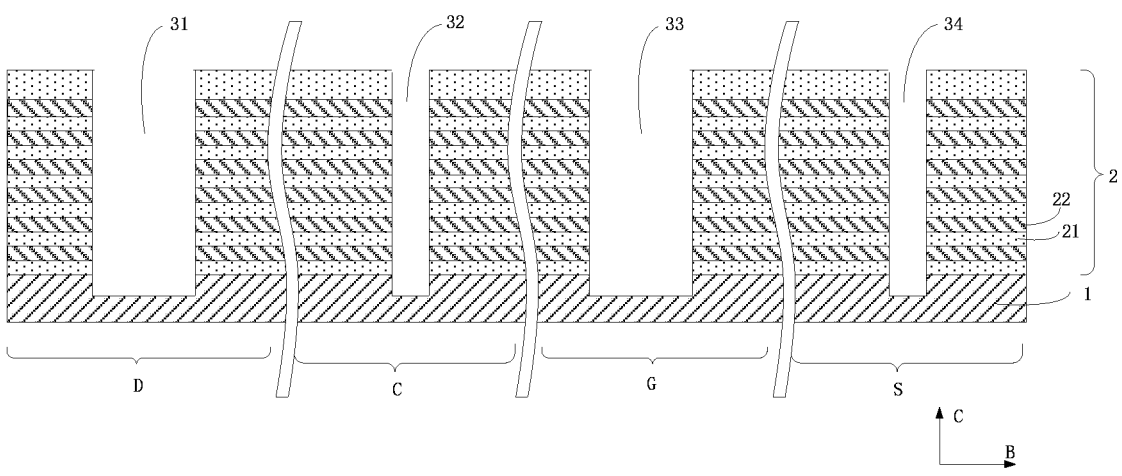

As shown in FIGS. 3a and 3b, FIG. 3b is the sectional views along dashed line A1A1', B1B1', C1C1' and D1D1' in FIG. 3a. The stack 2 may include a core region C and a periphery region D distributed along the first direction A. The stack 2 may further include a transition region G located on a side of the core region C away from the periphery region G along the first direction A. The stack 2 may further include a staircase region S located on a side of the transition region G away from the core region C along the first direction A. As shown in FIG. 3a, the stack 2 includes a staircase region S, two transition regions G, two core regions C and two periphery regions D, one periphery region D, one core region C, one transition region G, a staircase region S, another transition region G, another core region C and another periphery region D distributed successively along the first direction A.

Before providing the stack 2, a base 1 may be provided first. The base 1 is located in the periphery region G, the core region C, the transition region G, and the staircase region S. The base 1 may be a substrate. For example, the material for the base 1 may include single crystalline silicon, poly-crystalline silicon, single-crystalline germanium, III-V compound semiconductor materials, II-V compound semiconductor materials or other semiconductor materials. The base 1 may also be a multi-layer composite structure. For example, the base 1 may include an silicon oxide layer and a polysilicon layer disposed alternatively. In addition, in subsequent fabrication process, it is possible to remove the base 1 such that the ultimately formed semiconductor device has no base 1.

The stack 2 is located on a side of the base 1. The stack 2 includes interlayer insulation layers 21 and interlayer sacrifice layers 22 stacked alternatively along the third direction C. The third direction C intersects with, for example, perpendicular to, the first direction A. The number of stacked layers in stack 2 may be 32, 64, 128 etc., which is not limited herein. The material for interlayer insulating layers 21 may include at least one of silicon oxide, silicon nitride, silicon oxynitride, doped silicon oxide, and organic silicate glass, and the material for interlayer sacrifice layers 22 may include at least one of silicon nitride, polysilicon, and poly-germanium. The materials for interlayer insulating layers 21 and the material for interlayer sacrifice layers 22 are different. For example, the material for interlayer insulating layers 21 is silicon oxide, and the material for interlayer sacrifice layers 22 is silicon nitride.

The stack 2 in the core region C further has a memory channel structure (not shown in the figures) that may penetrate the stack 2 from a side of the stack 2 away from the base 1 along the third direction C and extend into the base 1. The memory channel structure may include a channel filling layer (not shown in the figure), a channel layer disposed around the channel filling layer (not shown in the figure), and a memory medium layer disposed around the channel layer (not shown in the figure). The memory medium layer may include a tunnel layer disposed around the channel layer (not shown in the figure), a charge storage layer disposed around the tunnel layer (not shown in the figure), and a charge barrier layer disposed around the charge storage layer (not shown in the figure). Therein, the channel filling layer may be of oxides such as silicon oxide, silicon nitride, silicon oxynitride, and the channel layer may be a semiconductor layer such as polysilicon, the tunnel layer may be of oxides such as silicon oxide, silicon nitride, silicon oxynitride, the charge storage layer may be an insulating layer including quantum dots or nanocrystals or including compounds of nitrogen and silicon, and the charge barrier layer may be of oxides such as silicon oxide.

The stack 2 in the periphery region D, the transition region G, and the staircase region S further has dummy channel structures (not shown in the figure). The dummy channel structure may penetrate the stack 2 from a side of the stack 2 away from the base 1 along the third direction C and extend into the base 1. The dummy channel structure may be the same as the memory channel structure and will not be described in detail here.

Step 102, forming a gate line slit penetrating the stack and extending along the first direction, wherein the gate line slit includes a first slit and a second slit interconnected with each other, the periphery region includes the first slit, the core region includes the second slit, the width of the first slit along the second direction is greater than the width of the second slit along the second direction.

As shown in FIGS. 3a and 3b, the stack 2 is etched with etch process to form the gate line slit 3. The gate line slit 3 extends along the first direction A such that the gate line slit 3 is located in the periphery region D, the core region C, the transition region G, and the staircase region S. Along the third direction C, the gate line slit 3 penetrates the stack 2 from a side of the stack 2 away from the base 1. In some embodiments, the gate line slit 3 further extends into the base 1.

The gate line slit 3 includes a first slit 31 and a second slit 32 interconnected with each other, the periphery region D includes the first slit 31, and the core region C includes the second slit 32. Specifically, the second slit 32 may extend along the first direction A in the core region C and to the periphery region D to be interconnected with the first slit 31. The width of the first slit 31 along the second direction B is greater than the width of the second slit 32 along the second direction B. The second direction B intersects with the first direction A and the third direction C. For example, the second direction B, the first direction A, and the third direction C are perpendicular to each other.

The width of the first slit 31 in the periphery region D along the second direction B is greater than the width of the second slit 32 in the core region C along the second direction B, such that an isolation section may be formed in the first slit 31 subsequently. The width of the isolation section in the first slit 31 along the second direction B is greater to form an isolation barrier at the first slit 31. While replacing the interlayer sacrifice layers 22 in the core region C with the gate layers via the second slit 32 subsequently, the interlayer sacrifice layers 22 in the periphery region D may be prevented from being replaced with the gate layers, that is, the interlayer sacrifice layers 22 in the periphery region D are remained, such that the periphery region D constitutes an isolation region for isolating memory blocks. Further, the gate line slit 3 extends along the first direction A and needs not to be designed as a homocentric rectangle, thereby improving the structure stability. The gate line slit in the core region C needs not to be designed as H-cuts either, thereby reducing the fabrication difficulty.

Structures of the gate line slit 3 in transition region G and staircase region S may be designed in various manners as long as it is guaranteed that the gate line slit 3 extends along the first direction A.

In one implementation, the gate line slit 3 may further include a third slit 33 interconnected with the second slit 32, and the transition region G includes the third slit 33. Specifically, the second slit 32 may further extend along the first direction A from the core region C to the transition region G and is connected with the third slit 33. The width of the third slit 33 along the second direction B is greater than the width of the second slit 32 along the second direction B. In addition, the length of the first slit 31 along the first direction A is greater than the length of the third slit 33 along the first direction A. The width of the first slit 31 along the second direction B may equal the width of the first slit 31 along the second direction B.

The gate line slit may further include a fourth slit 34 interconnected with the third slit 33 and the staircase region S includes the fourth slit 34. Specifically, the fourth slit 34 may extend along the first direction A in the staircase region S to the transition region G and is connected with the third slit 33. The width of the third slit 33 along the second direction B is greater than the width of the fourth slit 34 along the second direction B. In addition, the width of the fourth slit 34 along the second direction B may equal the width of the second slit 32 along the second direction B.

In the present embodiment, the gate line slit 3 extends along the first direction A and needs not to be designed as a homocentric rectangular gate line slit, thereby improving the structure stability, and it needs not to be designed as H-cuts either, thereby reducing the fabrication difficulty.

Step 103, forming an isolation section in at least the first slit.

In an embodiment of the present application, after forming the gate line slit 3, since the width of the first slit 31 in the periphery region D along the second direction B is greater than the width of the second slit 32 in the core region C along the second direction B such that the width of the isolation section formed in the first slit 31 along the second direction B is greater to form an isolation barrier at the first slit 31. While replacing the interlayer sacrifice layers 22 in the core region C with the gate layers via the second slit 32 subsequently, the interlayer sacrifice layers 22 in the periphery region D may be prevented from being replaced with the gate layers. That is, the interlayer sacrifice layers 22 in the periphery region D remain, and the first slit 31 has an isolation section, such that the periphery region D constitutes an isolation region for isolating memory blocks.

The isolation section may be further formed in the third slit 33. Specifically, the forming an isolation section at least in the first slit in step 103 includes: forming the isolation section at least in the first slit and the third slit.

Forming the isolation section in the third slit 33 simultaneously with forming the isolation section in the first slit 31. The isolation section in the third slit 33 may isolate the second slit 32 and the fourth slit 34 to etch the interlayer sacrifice layers 22 in the core region C and the staircase region S, respectively.

Specifically, the step of forming the isolation section at least in the first slit and the third slit includes: forming sacrifice layers on a side of the stack which fill the second slit and the fourth slit and cover the inner surfaces of the first slit and the third slit; removing sacrifice layers on a side of the stack and the sacrifice layer in the first slit and the third slit; and forming an isolation section on a side of the stack which fill the first slit and the third slit.

Since the gate line slit 3 extends into the base 1, in order to prevent the sacrifice layer from contacting the base 1 and conducting electricity, a protection layer needs to be formed first, and then a sacrifice layer needs to be formed in the gate line slit 3.

Specifically, before the step of forming the sacrifice layer, the method further includes: forming a protection layer at the base exposed in the gate line slit.

Figure 3C:
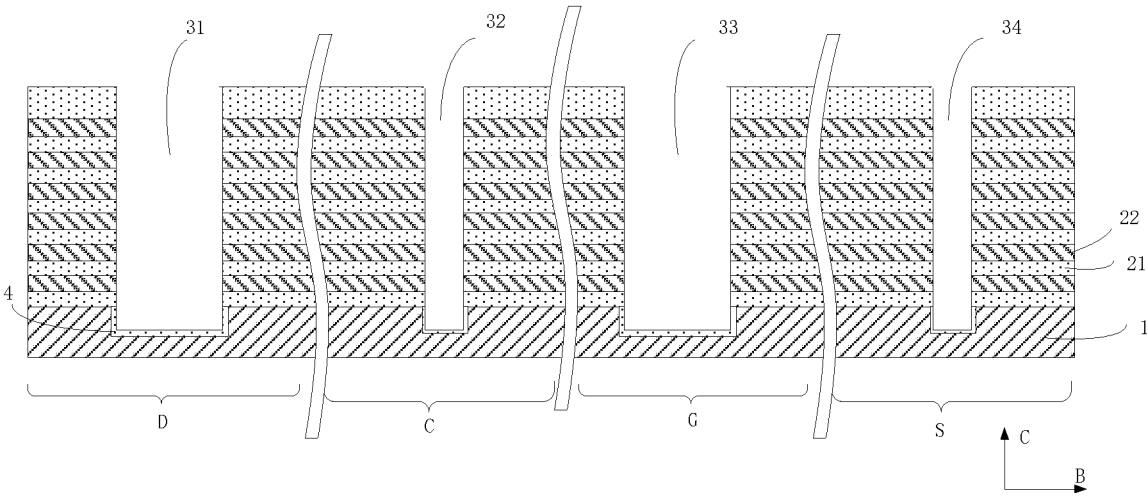

As shown in FIG. 3c, while the gate line slit 3 extends into the base 1, the gate line slit 3 exposes the base 1, and a protection layer 4 is formed on the surface of the base 1 exposed in the gate line slit 3. In order to make the protection layer 4 to be located only on the surface of the base 1 exposed in the gate line slit 3 and prevent the protection layer 4 from locating on other films as to influence other films' structures, the protection layer 4 may be formed with an oxidation process.

Specifically, the step of forming a protection layer at the base exposed in the gate line slit includes: oxidizing the base exposed in the gate line slit to form the protection layer.

The base 1 exposed in the gate line slit 3 is oxidized with an oxidation process to form a protection layer 4 on the surface of the base 1 exposed in the gate line slit 3. As shown in FIG. 3c, the protective layer 4 is formed on the surface of the base 1 exposed in the first slit 31, the second slit 32, the third slit 33, and the fourth slit 34. The material for the protective layer 4 may be an oxide. For example, the material for base 1 is silicon, and the material for the protective layer may be silicon oxide.

Figure 3D:
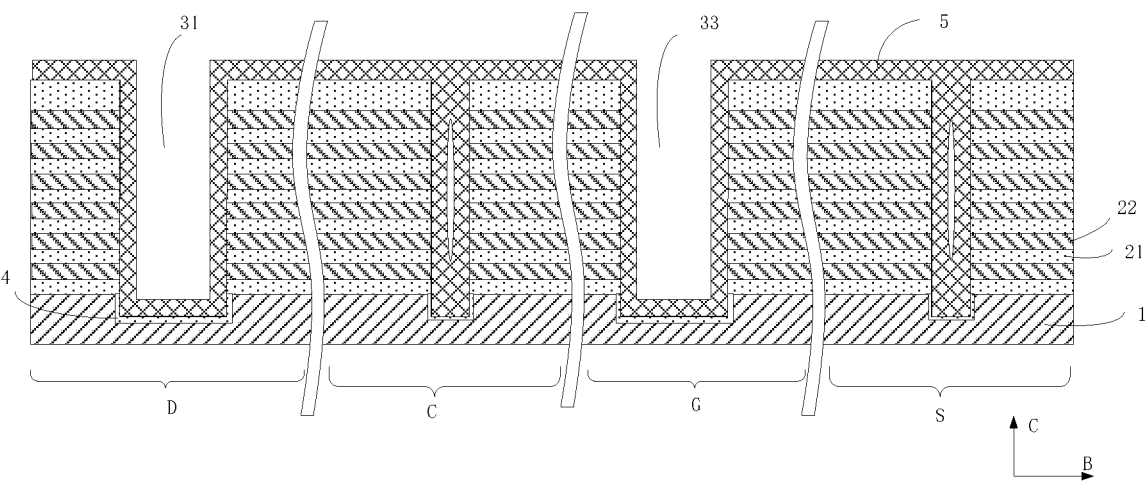

After forming the protective layer 4, as shown in FIG. 3d, a sacrifice layer 5 is formed on a side of the stack 2 away from the base 1, and the sacrifice layer 5 extends to inner surfaces (including sidewalls and bottoms) of the first slit 31 and the third slit 33 and fills the second slit 32 and the fourth slit 34.

Since the width of the first slit 31 and the third slit 33 along the second direction B is greater than the width of the second slit 32 and the fourth slit 34 along the second direction B, when the second slit 32 and the fourth slit 34 are filled up with the sacrifice layer 5, the first slit 31 and the third slit 33 are not filled up with the sacrifice layer 5. That is, the sacrifice layer 5 is located only on the inner surfaces of the first slit 31 and the third slit 33.

Figure 3E:
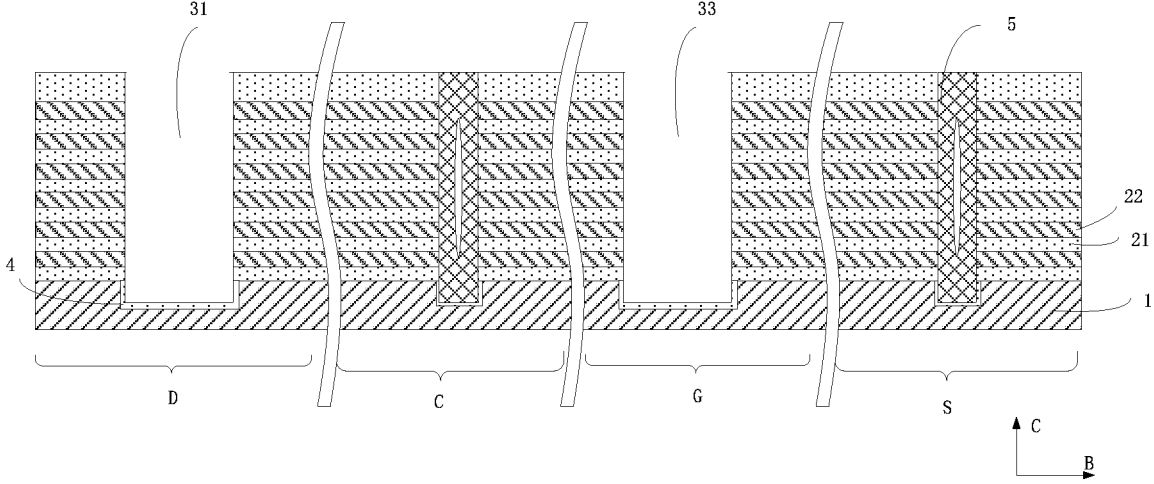

Then, since the thickness of the sacrifice layer 5 on a side of the stack 2 away from the base 1 and the sacrifice layer 5 in the first slit 31 and the third slit 33 is small, and the second slit 32 and the fourth slit 34 are filled up with the sacrifice layer 5, so when removing the sacrifice layer 5 on the side of the stack 2 away from the base 1, the sacrifice layer 5 in the first slit 31 and the third slit 33 will be removed simultaneously, while the sacrifice layer 5 in the second slit 32 and the fourth slit 34 will be removed. As shown in FIG. 3e, the sacrifice layer 5 on the side of the stack 2 away from the base 1 and the sacrifice layer 5 in the first slit 31 and the third slit 33 is removed, and the sacrifice layer 5 in the second slit 32 and the fourth slit 34 remains. The material for the sacrifice layer 5 may include polysilicon.

After exposing the first slit 31 and the third slit 33, it is possible to form an isolation section in the first slit 31 and the third slit 33. In some embodiments, in order to enhance the isolation effect at the first slit 31 and the third slit 33, the interlayer sacrifice layers 22 exposed by the first slit 31 and the third slit 33 may be etched back to form an isolation section again.

Specifically, the step of forming the isolation section at least in the first slit and the third slit includes: etching the interlayer sacrifice layers exposed in the first slit and the third slit to form the first gap interconnected with the second slit and the second gap interconnected with the third slit; and forming the isolation section in the second slit, the first gap, the third slit, and the second gap.

Figure 3F:
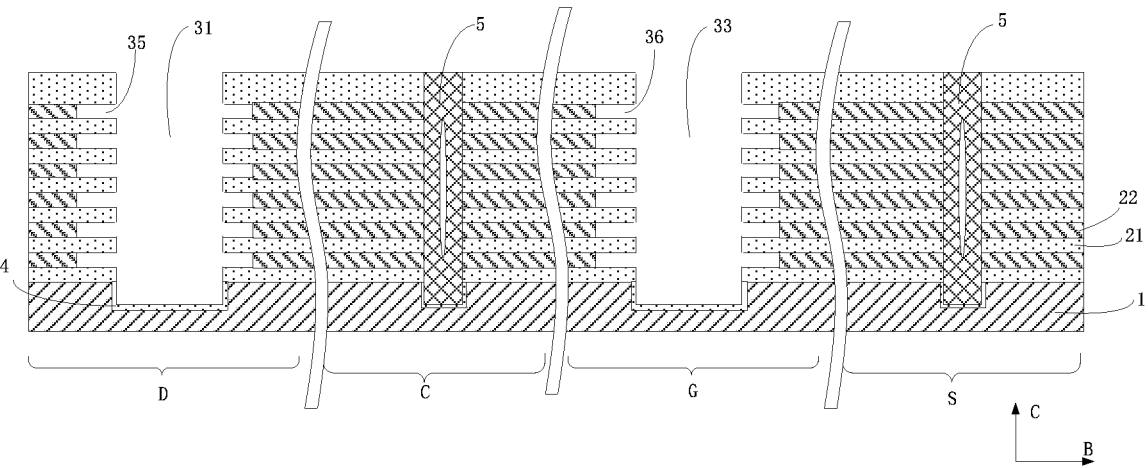

As as shown in FIG. 3f, etching the interlayer sacrifice layers 22 exposed by the first slit 31 and the third slit 33 to form the first gap 35 and the second gap 36 between adjacent interlayer insulating layers 21. The first gap 35 is interconnected with the first slit 31, and the second gap 36 is interconnected with the third slit 33.

Figure 3G:
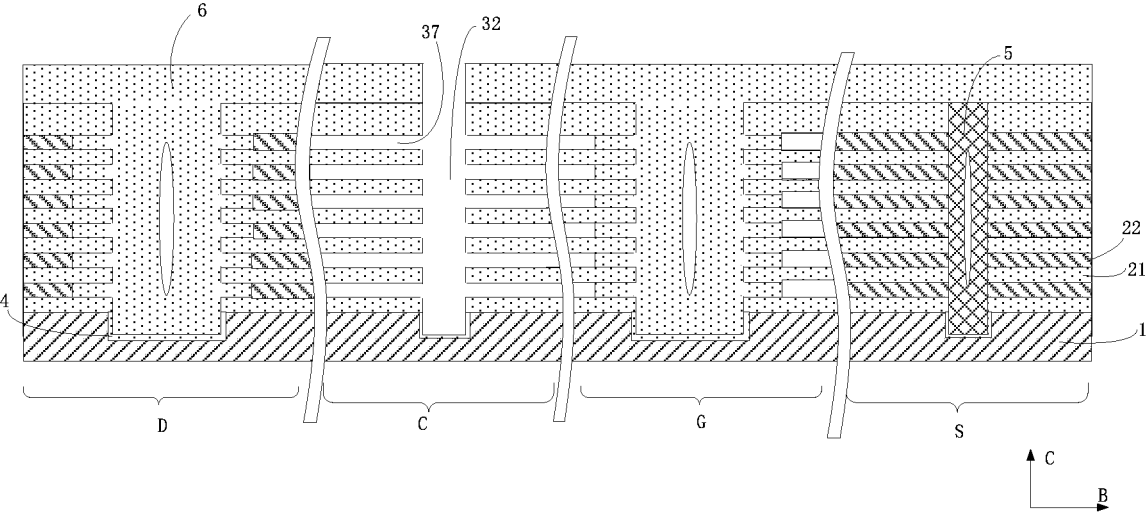

Then, as shown in FIG. 3g, an isolation section 6 is formed on a side of the stack 2 away from the base 1, and the isolation section 6 fills the first slit 31, the first gap 35, the third slit 33, and the second gap 36. The isolation section 6 filled in the first slit 31 may constitute a first slit structure, and the isolation section 6 filled in the third slit 33 may constitute a third slit structure. The material for the isolation section 6 may include at least one of silicon oxide, silicon nitride, silicon oxynitride, doped silicon oxide, and organic silicate glass. The material for the isolation section 6 is different from the material for the interlayer sacrifice layers 22. For example, the material for the interlayer sacrifice layers 22 is silicon nitride, and the material for the isolation section 6 is silicon oxide.

It is to be noted that the first slit structure (i.e., the isolation section 6 in the first slit 31) can prevent the interlayer sacrifice layers 22 in the periphery region D from being replaced with the gate layers subsequently, that is, the interlayer sacrifice layers 22 in the periphery region D remain such that the periphery region D constitutes an isolation region for separating memory blocks. The third slit structure (i.e., the isolation section 6 in the third slit 33) may isolate the second slit 32 and the fourth slit 34, such that the sacrifice layer in the gate line slit 3 in the regions nearby the core region C (including the transition region G and the staircase region S) will not be etched while removing the sacrifice layer in gate line slit 3 in the core region C (i.e., the sacrifice layers in the second slit 32), thereby shortening the length of the transition region G in the first direction A and reducing the volume of the semiconductor device.

After forming the isolation section 6 in the first slit 31 and the third slit 33, it is possible to replace the interlayer sacrifice layers 22 in the core region C and the staircase region S with the gate layers. Specifically, the method further includes: removing sacrifice layer in the second slit and the fourth slit to replace the portion of the interlayer sacrifice layers with the gate layers via the second slit and the fourth slit, wherein the gate layers are located in the core region, the transition region and the staircase region.

Since the second slit 32 and the fourth slit 34 are isolated by the isolation section 6 in the third slit 33, the sacrifice layer 5 in the second slit 32 and the fourth slit 34 may be removed separately, and the interlayer sacrifice layers 22 in the core region C and the staircase region S may be in turn removed separately.

In some embodiments, the interlayer sacrifice layers 22 in the core region C are removed first, then a portion of the interlayer sacrifice layers 22 in the staircase region S is removed.

Specifically, the step of removing sacrifice layers in the second slit and the fourth slit to replace a portion of the interlayer sacrifice layers with the gate layers via the second slit and the fourth slit includes: removing the sacrifice layer in the second slit; removing the interlayer sacrifice layers in the core region and the transition region via the second slit to form a third gap interconnected with the second slit; removing the sacrifice layer in the fourth slit; removing a portion of the interlayer sacrifice layers in the staircase region via the fourth slit to form a fourth gap interconnected with the fourth slit; and forming the gate layers in the third gap and the fourth gap.

As shown in FIG. 3g, the isolation section 6 on top of the second slit 32 (namely, the side of the second slit 32 away from the base 1) is removed, and the sacrifice layer 5 in the second slit 32 is removed to expose the second slit 32. Then, all the interlayer sacrifice layers 22 in the core region C and the transition region G are removed to form the third gap 37 between adjacent interlayer insulating layers 21 in the core region C and the transition region G. The third gap 37 is interconnected with the second slit 32. It is to be noted that the length of the third slit 33 along the first direction A is smaller than the length of the first slit 31 along the first direction A such that when removing interlayer sacrifice layers 22 in the core region C via the second slit 32, the interlayer sacrifice layers 22 in the transition region G will be removed at the same time while the interlayer sacrifice layers 22 in the periphery region D will not be removed (or will not be completely removed in the first direction A), so that the interlayer sacrifice layers 22 in the periphery region D remains.

Figure 3H:
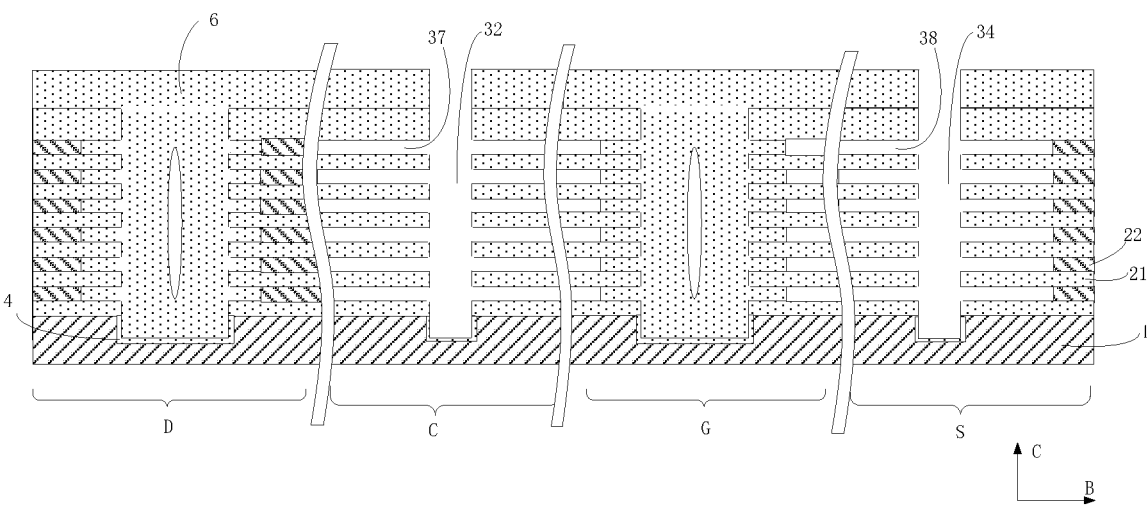

Then, as shown in FIG. 3h, the isolation section 6 on top of the fourth slit 34 (namely the side of the fourth slit 34 away from the base 1) is removed, and the sacrifice layer 5 in the fourth slit 34 is removed to expose the fourth slit 34. Then, a portion of the interlayer sacrifice layers 22 in the staircase region S is removed to form the fourth gap 38 between adjacent interlayer insulating layers 21 in the staircase region S. The fourth gap 38 is interconnected with the fourth slit 34.

It is to be noted that in order to prevent the interlayer insulating layers 21 in the core region C and the transition region G from being influenced while removing a portion of the interlayer sacrifice layers 22 in the staircase region S, a thin cap layer (which may be of the same material as the interlayer sacrifice layers 22 such as silicon nitride) on the surface of the interlayer insulating layers 21 exposed by the third slit 37 and second slit 32 may be formed before removing the isolation section 6 on top of the fourth slit 34, to remove the cap layer in the third slit 37 and the second slit 32 at the same time as removing the portion of the interlayer sacrifice layers 22 in the staircase region S.

Figure 3I:
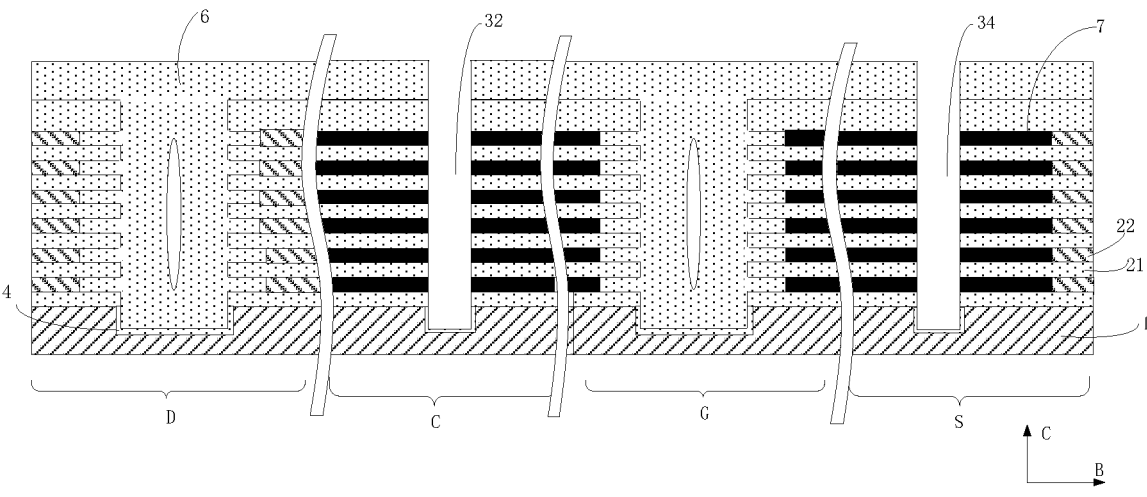

Then, as shown in FIG. 3i, the gate layers 7 are formed in the third slit 37 and the fourth slit 34. The gate layers 7 are located in the core region C, the transition region G, and the staircase region S, the remaining interlayer sacrifice layers 22 are located in the staircase region S and the periphery region D, and the gate layers 7 and the remaining interlayer sacrifice layers 22 are disposed in the same layer. The material for the gate layers 7 may include at least one of tungsten, cobalt, copper, aluminum, doped polysilicon, and metal silicide.

In some other embodiments, the portion of the interlayer sacrifice layers 22 in the staircase region S is removed first, then the interlayer sacrifice layers 22 in the core region C are removed.

Specifically, the isolation section 6 on top of the fourth slit 34 is removed first, and the sacrifice layer 5 in the fourth slit 34 is removed to expose the fourth slit 34. Then, a portion of the interlayer sacrifice layers 22 in the staircase region S is removed to form the fourth gap 38 between adjacent interlayer insulating layers 21 in the staircase region S. The fourth gap 38 is interconnected with the fourth slit 34. Then, the isolation section 6 on top of the second slit 32 is removed, and the sacrifice layer 5 in the second slit 32 is removed to expose the second slit 32. Then, the interlayer sacrifice layers 22 in the core region C and the transition region G are removed to form the third gap 37 between adjacent interlayer insulating layers 21 in the core region C and the transition region G. The third gap 37 is interconnected with the second slit 32. Then, the gate layers 7 are formed in the third slit 37 and the fourth slit 34.

Figure 3J:
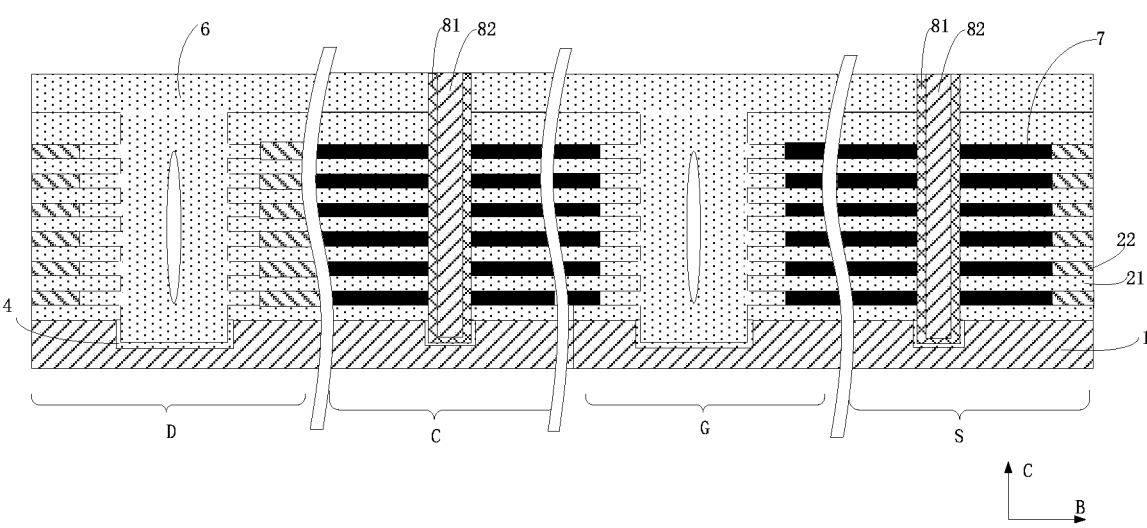

After replacing the interlayer sacrifice layers 22 in the core region C and the staircase region S with the gate layers 7, a gap structure may be formed in the second slit 32 and the fourth slit 34. As shown in FIG. 3j, a spacer layer 81 is formed first on the inner surfaces of the second slit 32 and the fourth slit 34 with a film deposition process, and then a conductive layer 82 is filled in the second slit 32 and the fourth slit 34. The spacer layer 81 and the conductive layer 82 in the second slit 32 constitute the second slit structure, and the spacer layer 81 and the conductive layer 82 in the fourth slit 34 constitute the fourth slit structure. The material for the spacer layer 81 may include at least one of silicon oxide, silicon nitride, silicon oxynitride, doped silicon oxide, and organic silicate glass. The material for the conductive layer 82 may include polysilicon.

Figure 4A:
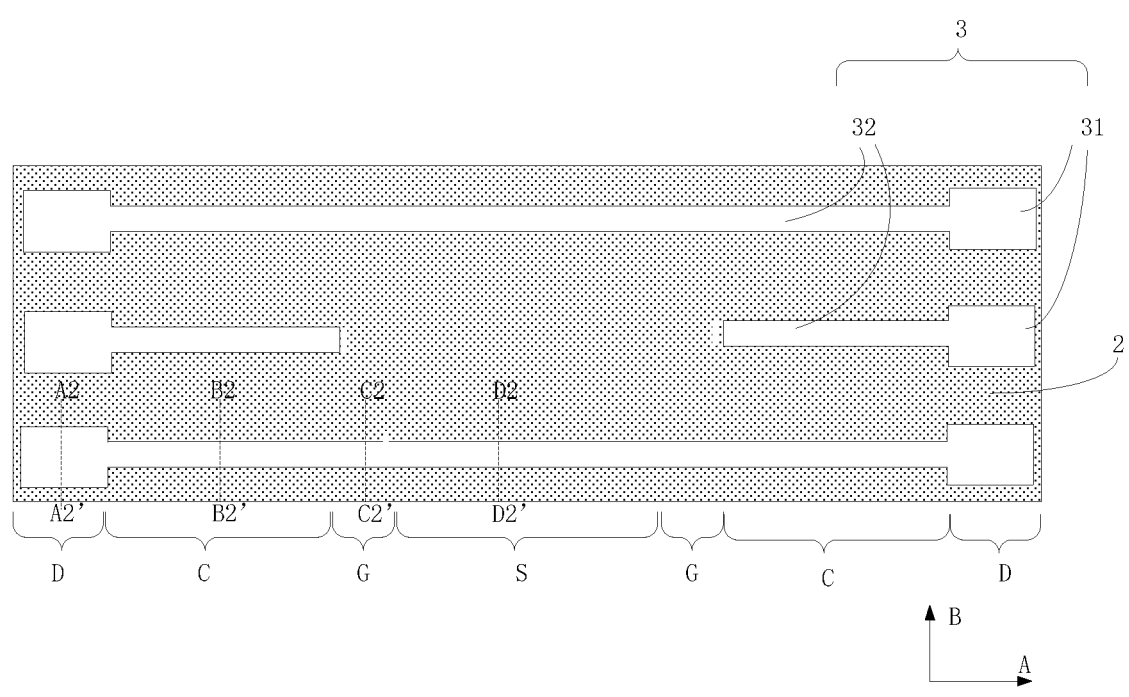
FIGS. 4a-4f are second structural diagrams illustrating a method of fabricating a semiconductor device provided by an embodiment of the present application.
Figure 4B:
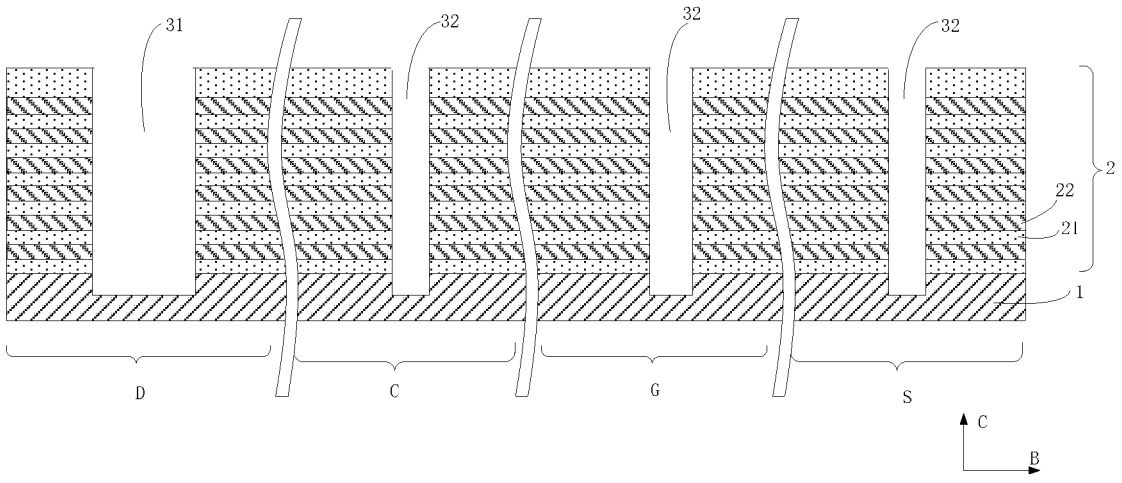

In another implementation, as shown in FIGS. 4a and 4b, FIG. 4b is sectional views along dashed line A2A2', B2B2', C2C2' and D2D2' in FIG. 4a. The gate line slit 3 includes a first slit 31 and a second slit 32 interconnected with each other, the periphery region D includes the first slit 31, and the core region C, the transition region G and the staircase region S include the second slit 32. Specifically, the second slit 32 extends along the first direction A in the core region C, the transition region G, and the staircase region S and to the periphery region D to be connected with the first slit 31. The width of the first slit 31 along the second direction B is greater than the width of the second slit 32 along the second direction B.

Figure 4C:
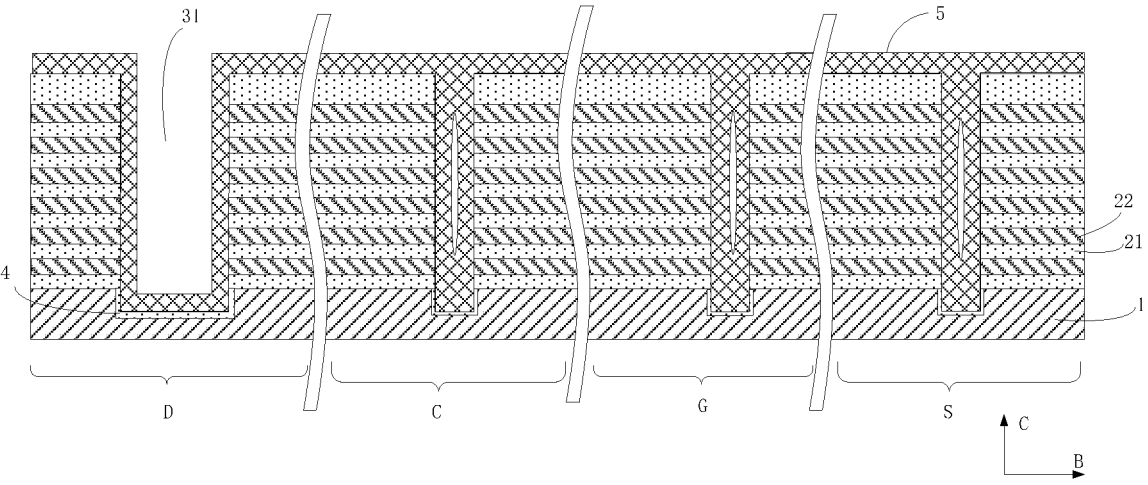

As shown in FIG. 4b, in the third direction C, the gate line slit 3 extends from a side of the stack 2 away from the base 1 into the base 1 to expose the base 1. As shown in FIG. 4c, the base 1 exposed in the gate line slit 3 is oxidized with an oxidation process to form a protection layer 4 on the surface of the base 1 exposed in the gate line slit 3. Then, a sacrifice layer 5 is formed on a side of the stack 2 away from the base 1 with film deposition process, and the sacrifice layer 5 fills the second slit 32 and covers the inner surfaces of the first slit 31.

Figure 4D:
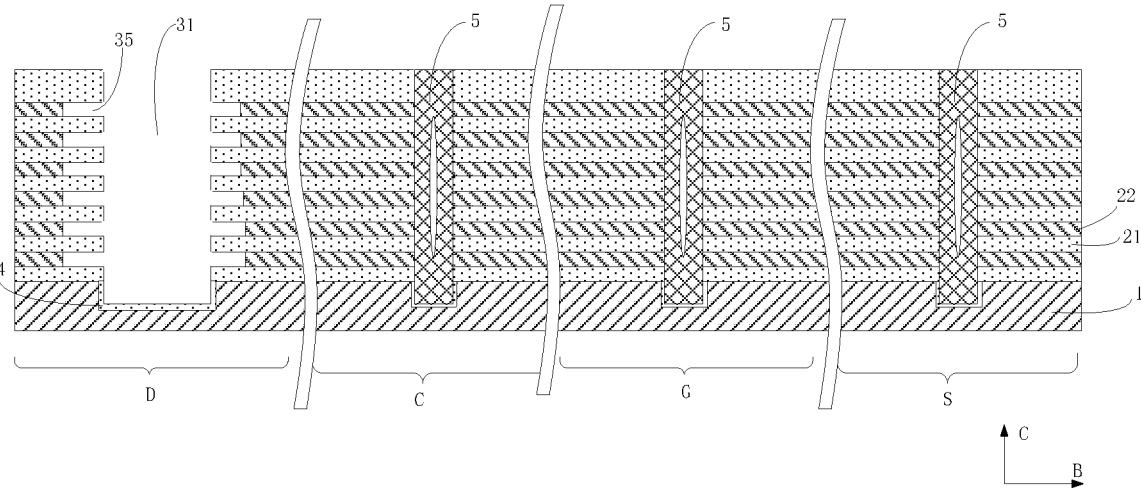

As shown in FIG. 4d, the sacrifice layer 5 on a side of the stack 2 away from the base 1 and the sacrifice layer 5 in the first slit 31 is removed by the etching process to expose the first slit 31. Since the second slit 32 is filled up with the sacrifice layer 5, the sacrifice layer 5 in the second slit 32 remains. Then, the interlayer sacrifice layers 22 exposed by the first slit 31 are etched to form the first gap 35 between interlayer insulating layers 21, and the first gap 35 is interconnected with the first slit 31.

Figure 4E:
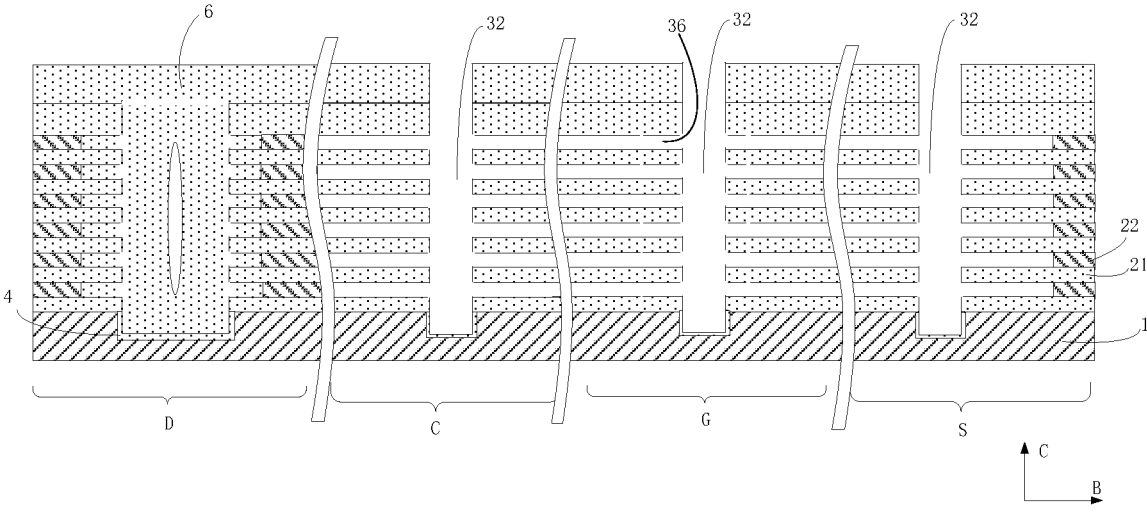

As shown in FIG. 4e, an isolation section 6 is formed on a side of the stack 2 away from the base 1 with film deposition process, and the isolation section 6 fills the first slit 31 and the first gap 35, and the isolation section 6 formed in the first slit 31 constitute the first slit structure. Then, the isolation section 6 on top of the second slit 32 and the sacrifice layer 5 in the second slit 32 are removed to expose the second slit 32. The interlayer sacrifice layers 22 in the core region C, the transition region G and the staircase region S are etched via the second slit 32 to remove all the interlayer sacrifice layers 22 in the core region C and the transition region G and a portion of the interlayer sacrifice layers 22 in the staircase region S, thereby forming the second gap 36 between interlayer insulating layers 21, and the second gap 36 is interconnected with the second slit 32.

Figure 4F:
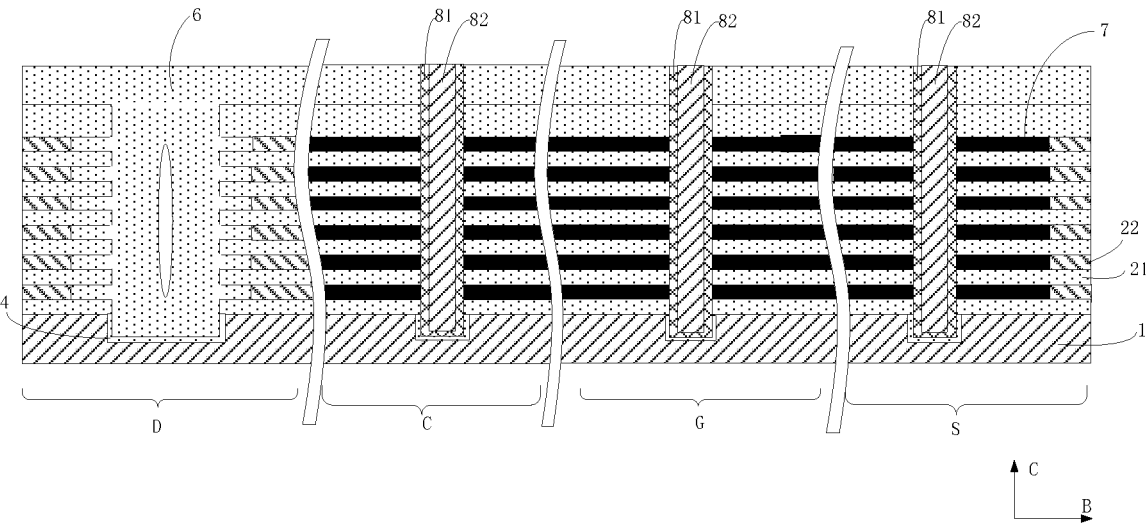

As shown in FIG. 4f, gate layers 7 are formed in the second slit 32 with a film deposition process such that the gate layers 7 are located in the core region C, the transition region G, and the staircase region S. Then, a gap structure is formed in the second slit 32. For example, an spacer layer 81 is formed first on the inner surfaces of the second slit 32, and a conductive layer 82 is then filled in the second slit 32. The spacer layer 81 and the conductive layer 82 in the second slit 32 constitute the second slit structure.

With the fabrication method of a semiconductor device provided in an embodiment of the present application, a gate line slit extending along the first direction may be formed. The gate line includes a first slit in the periphery region and a second slit in the core region, wherein the width of the first slit along the second direction is greater than the width of the second slit along the second direction. An isolation section is formed in the first slit to prevent the interlayer sacrifice layers in the periphery region from being replaced with the gate layers, thereby separating memory blocks. No homocentric rectangular gate line slit is needed, which improves the structure stability of the semiconductor device. No H-cut is needed in the core region C, which reduces the fabrication difficulty. Additionally, the gate line slit may further include a third slit in the transition region and a fourth slit in the staircase region, and the width of the third slit along the second direction is greater than the width of the second slit and the fourth slit along the second direction. An isolation section is formed in the third slit to separate the second slit and the fourth slit, which effectively avoids the influence of the interlayer sacrifice layers in regions near the the core region C while the interlayer sacrifice layers in the core region C are being removed, thereby shortening the size of the transition region G in the first direction A and reducing the volume of the semiconductor device.

Accordingly, an embodiment of the present application provides a semiconductor device that can be formed with the above-described method of fabricating a semiconductor device.

Figure 5:
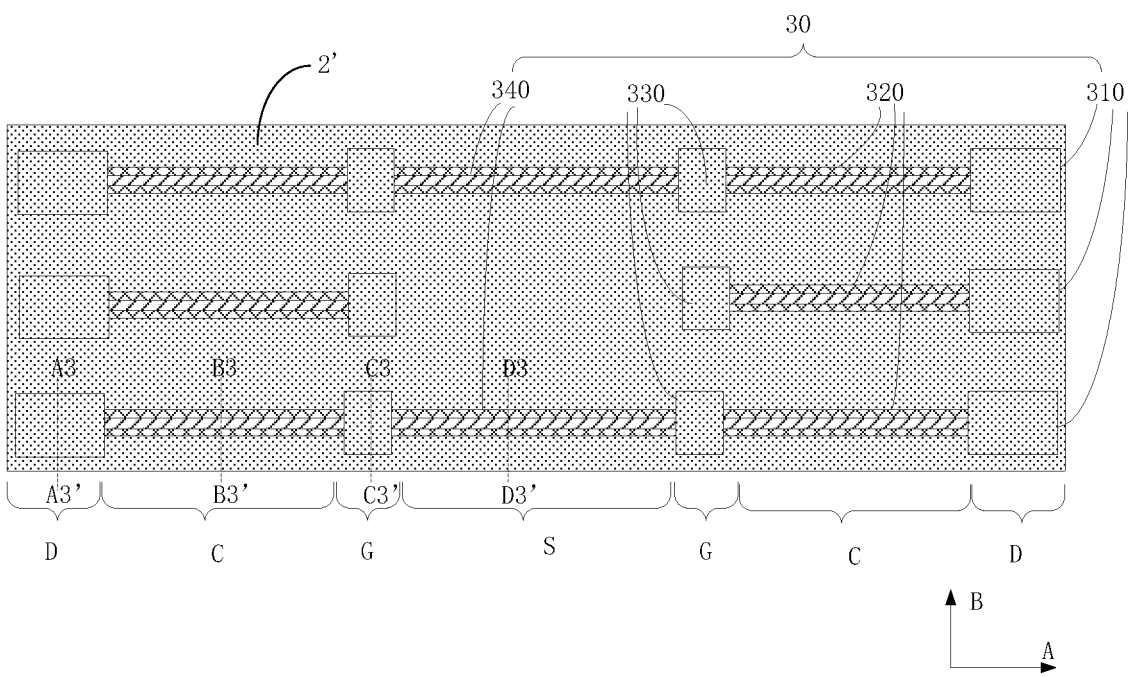
FIG. 5 is a first structural diagram of a semiconductor device provided by an embodiment of the present application.
Figure 6:
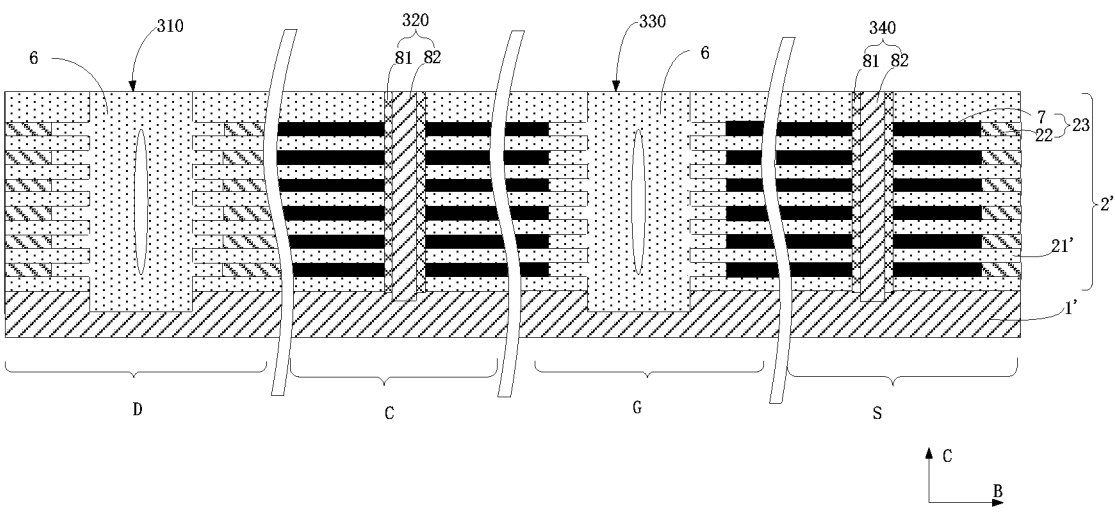
FIG. 6 is a second structural diagram of a semiconductor device provided by an embodiment of the present application.
Figure 7:
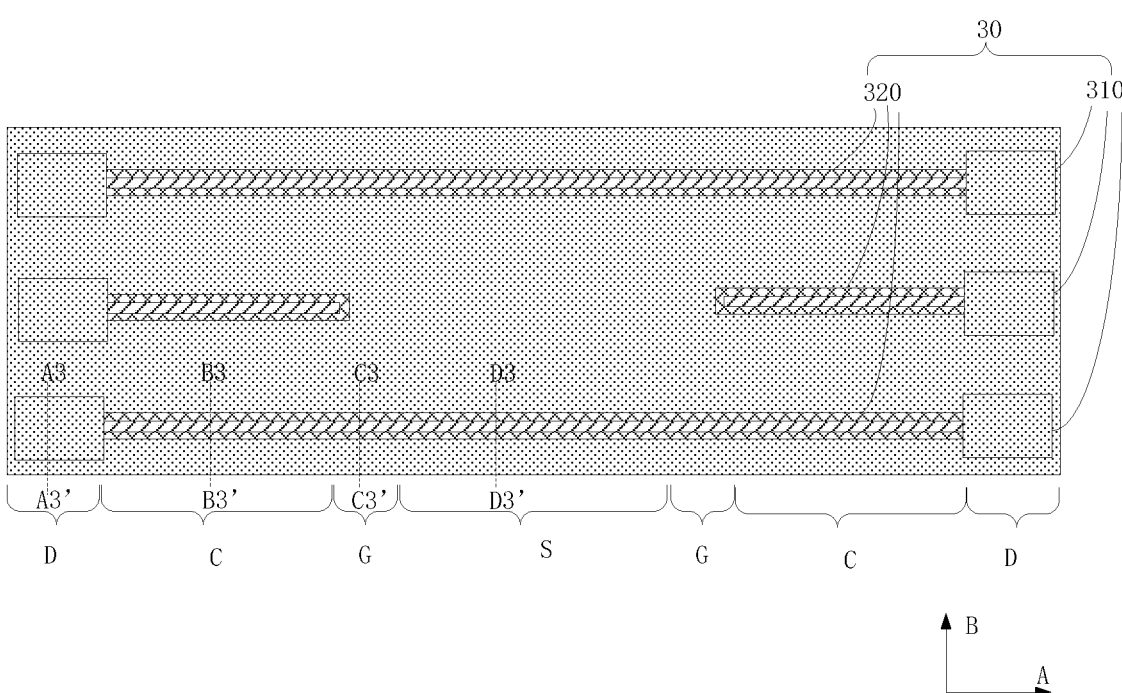
FIG. 7 is a third structural diagram of a semiconductor device provided by an embodiment of the present application.
Figure 8:
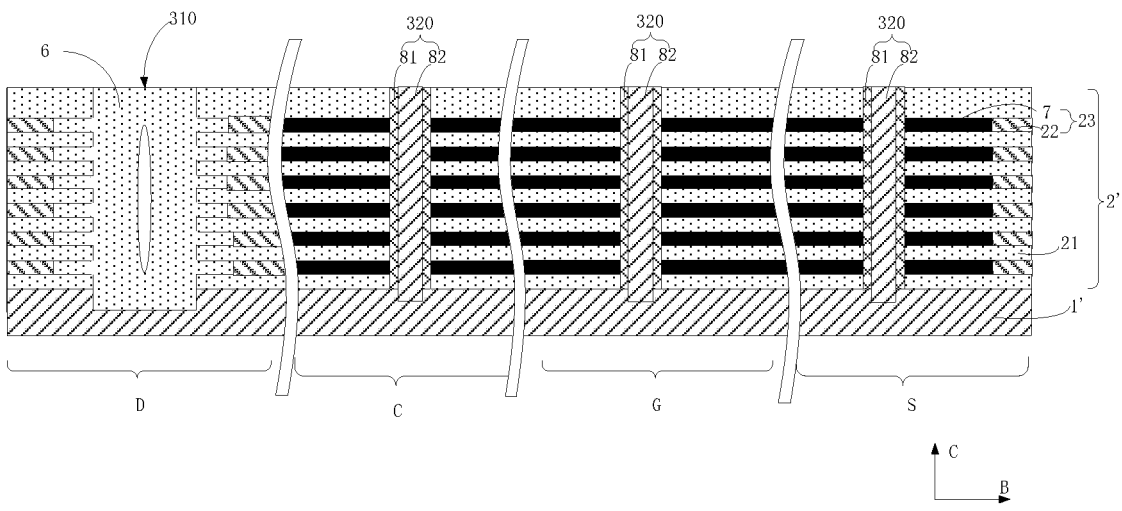
FIG. 8 is a fourth structural diagram of a semiconductor device provided by an embodiment of the present application.

Referring to FIGS. 5 to 8, FIG. 6 is sectional views along dashed lines A3A3', B3B3', C3C3' and D3D3' in FIG. 5, and FIG. 8 is sectional views along dashed lines A4A4', B4B4', C4C4' and D4D4' in FIG. 7.

As shown in FIGS. 5 to 8, the semiconductor device provided in an embodiment of the present application includes a stack structure 2' and a gate line slit structure 30. The stack structure 2' may include a core region C and a periphery region D distributed along the first direction A. The stack structure 2' may further include a transition region G located on a side of the core region G away from the periphery region G along the first direction A. The stack structure 2' may further include a staircase region S located on a side of the transition region G away from the core region C along the first direction A.

The semiconductor device may further include a semiconductor layer 1'. The semiconductor layer 1' is located in the periphery region G, the core region C, the transition region G, and the staircase region S. The material for the semiconductor layer 1' may include single crystalline silicon, poly-crystalline silicon, single-crystalline germanium, and III-V compound semiconductor materials.

The stack structure 2' is on a side of the semiconductor layer 1'. The stack structure 2' may include a first material layers 21' and a second material layers 23 stacked alternatively in the third direction C. The number of stacked layers in stack structure 2' may be 32, 64, 128 etc., which is not limited herein. The first material layers 21' may include an interlayer insulating layer, and the second material layers 23 may include an gate layer 7 and an interlayer sacrifice layer 22. The gate layers 7 are located in the core region C, the transition region G and the staircase region S, the interlayer sacrifice layers 22 are located in the periphery region G and the staircase region S, and the gate layers 7 and the interlayer sacrifice layers 22 are disposed in the same layer. That is, the stack structure 2' in the core region C, the transition region G, and partial staircase region S may include the interlayer insulating layers and the gate layers 7 stacked alternatively, while the stack structure 2' in the periphery region D and another part of the staircase region S may include interlayer insulating layers and the interlayer sacrifice layers 22 stacked alternatively.

The material for the first material layers 21' may include at least one of silicon oxide, silicon nitride, silicon oxynitride, doped silicon oxide and organic silicate glass. The material for the gate layers 7 may include at least one of tungsten, cobalt, copper, aluminum, doped polysilicon, and metal silicide. The material for the interlayer sacrifice layers 22 may include at least one of silicon nitride, polysilicon, and poly-germanium. The material for first material layers 21' and the material for interlayer sacrifice layers 22 are different. For example, the material for the first material layers 21 are silicon oxide, and the material for interlayer sacrifice layers 22 are silicon nitride.

The semiconductor device may further include a memory channel structure (not shown in the figures) in the core region C that may penetrate the stack structure 2' from a side of the stack structure 2' away from the semiconductor layer 1' along the third direction C and extend into the semiconductor layer 1'. The memory channel structure may include a channel filling layer (not shown in the figure), a channel layer disposed around the channel filling layer (not shown in the figure) and a memory medium layer disposed around the channel layer (not shown in the figure). The memory medium layer may include a tunnel layer disposed around the channel layer (not shown in the figure), a charge storage layer disposed around the tunnel layer (not shown in the figure), and a charge barrier layer disposed around the charge storage layer (not shown in the figure). The channel layer in the memory channel structure is connected with the semiconductor layer 1'. The channel filling layer may be of oxides such as silicon oxide, silicon nitride, or silicon oxynitride, the channel layer may be a semiconductor layer such as polysilicon, the tunnel layer may be of oxides such as silicon oxide, silicon nitride, silicon oxynitride, the charge storage layer may be an insulating layer including quantum dots or nanocrystals or including compounds of nitrogen and silicon, and the charge barrier layer may be of oxides such as silicon oxide.

The semiconductor device may further include a dummy channel structure (not shown in the figure) in the periphery region D, the transition region G, and the staircase region S. The dummy channel structure may penetrate the stack structure 2' from a side of the stack structure 2' away from the semiconductor layer 1' in the third direction C and extend into the semiconductor layer 1'. The dummy channel structure may be the same as the memory channel structure and will not be described in detail here.

The gate line slit structure 30 extends along the first direction A, and the gate line slit structure 30 is located in the periphery region D, the core region C, the transition region G, and the staircase region S. In the third direction C, the gate line slit structure 30 penetrates the stack structure 2' from a side of the stack structure 2' away from the semiconductor layer 1'. In some embodiments, the gate line slit structure 30 further extends into the semiconductor layer 1'.

The gate line slit structure 30 includes a first slit structure 310 and a second slit structure 320 interconnected with each other, the periphery region D includes the first slit structure 310, and the core region C includes the second slit structure 320. Specifically, the second slit structure 320 may extend along the first direction A in the core region C and to the periphery region D to be connected with the first slit structure 310. The width of the first slit structure 310 along the second direction B is greater than the width of the second slit structure 320 along the second direction B. The second direction B intersects with, for example, perpendicular to, the first direction A.

The provision of the first slit structure 310 prevents the gate layers 7 from extending into the periphery region D. That is, the stack structure 2' of the periphery region D includes first material layers 21' and interlayer sacrifice layers 22 stacked alternatively, and the width of the first slit structure 310 along the second direction B is larger such that the periphery region D constitutes an isolation region for separating memory blocks. Further, the gate line slit 3 in the embodiment of the present application extends along the first direction A and needs not to be designed as homocentric rectangular, thereby improving the structure stability. The core region C needs not to be designed with H-cuts either, thereby reducing the fabrication difficulty.

The first slit structure 310 may include an isolation section 6, and the second slit structure 320 may include a conductive layer 82 and a spacer layer 81 disposed around the conductive layer 82. The material for the isolation section 6 may include at least one of silicon oxide, silicon nitride, silicon oxynitride, doped silicon oxide, and organic silicate glass. The material for the isolation section 6 is different from the material for the interlayer sacrifice layers 22. For example, the material for the interlayer sacrifice layers 22 is silicon nitride, and the material for the isolation section 6 is silicon oxide. The material for the spacer layer 81 may include at least one of silicon oxide, silicon nitride, silicon oxynitride, doped silicon oxide, and organic silicate glass. The material for the conductive layer 82 may include polysilicon.

In some embodiments, the isolation section 6 further extends to the area between the first material layers 21' of the periphery region D. That is, the first slit structure 310 further extends to the area between the first material layers 21' of the periphery region D to further improve isolation effect of the periphery region D.

In one implementation, as shown in FIGS. 5 and 6, the gate line slit structure 30 may further include a third slit structure 330 interconnected with the second slit structure 320, and the transition region includes the third slit structure 330. Specifically, the second slit structure 320 may further extend along the first direction A from the core region C to the transition region G and is connected with the third slit structure 330. The width of the third slit structure 330 along the second direction B is greater than the width of the second slit structure 320 along the second direction B.

The provision of the third slit structure 330 may isolate the core region C and the staircase region S such that the gate layers 7 may be located in the core region C and partial staircase region S.

The third slit structure 330 may include an isolation section 6. That is, the third slit structure 330 may be of the same structure as the first slit structure 310. In some embodiments, the isolation section 6 further extends to the area between the first material layers 21' of the transition region G. That is, the third slit structure 330 further extends to the area between the first material layers 21' of the transition region G to further improve isolation effect of the third slit structure 330.

The length of the first slit structure 310 along the first direction A is greater than the length of the third slit structure 330 along the first direction A such that the gate layers 7 may extend from the core region C to the transition region G rather than extending into the periphery region D, that is, the gate layers 7 may be located in the core region C and the transition region G rather than in the periphery region D to guarantee electrical connection in memory blocks while separating memory blocks. In addition, the width of the first slit structure 310 along the second direction B may equal the width of the third slit structure 330 along the second direction B.

The gate line slit structure 30 may further include a fourth slit structure 340 interconnected with the third slit structure 330, and the staircase region S includes the fourth slit structure 340. Specifically, the fourth slit structure 340 may extend along the first direction A in the staircase region S to the transition region G and is connected with the third slit structure 330. The width of the third slit structure 330 along the second direction B is greater than the width of the fourth slit structure 340 along the second direction B.

The third slit structure 330 separates the second slit structure 320 and the fourth slit structure 340. This may allow the gate layers 7 to cover different ranges in the core region C and the staircase region S. That is, the gate layers 7 may cover the entire core region C, while only covering partial staircase region S, so as to provide a contact structure (SCT) connected with each gate layers 7 correspondingly in the other part of the staircase region S. In addition, the third slit structure 330 separates the second slit structure 320 and the fourth slit structure 340, which may shorten the size of the transition region G along the first direction A and reduce the volume of the semiconductor device.

The fourth slit structure 340 may include a conductive layer 82 and a spacer layer 81. That is, the fourth slit structure 340 may be of the same structure as the second slit structure 320.

In another implementation, as shown in FIGS. 7 and 8, the gate line slit structure 30 includes a first slit structure 310 and a second slit structure 320, the periphery region D includes the first slit structure 310 and the core region C, the transition region G and the staircase region S include the second slit structure 320. Specifically, the second slit structure 320 extends along the first direction A in the core region C, the transition region G, and the staircase region S and to the periphery region D to be connected with the first slit structure 310. The width of the first slit structure 310 along the second direction B is greater than the width of the second slit structure 320 along the second direction B.

The provision of the first slit structure 310 prevents the gate layers 7 from extending into the periphery region D. That is, the stack structure 2' of the periphery region D includes first material layers 21' and interlayer sacrifice layers 22 stacked alternatively, and the width of the first slit structure 310 along the second direction B is larger such that the periphery region D constitutes an isolation region for separating memory blocks. Further, the gate line slit 3 in the embodiment of the present application extends along the first direction A and needs not to be designed as a homocentric rectangular gate line slit, thereby improving the structure stability. And H-cuts need not be designed either, thereby reducing the fabrication difficulty.

The first slit structure 310 may include an isolation section 6, and the second slit structure 320 may include a conductive layer 82 and a spacer layer 81 disposed around the conductive layer 82. The material for the isolation section 6 may include at least one of silicon oxide, silicon nitride, silicon oxynitride, doped silicon oxide, and organic silicate glass. The material for the isolation section 6 is different from the material for the interlayer sacrifice layers 22. For example, the material for the interlayer sacrifice layers 22 is silicon nitride, and the material for the isolation section 6 is silicon oxide. The material for the spacer layer 81 may include at least one of silicon oxide, silicon nitride, silicon oxynitride, doped silicon oxide, and organic silicate glass. The material for the conductive layer 82 may include polysilicon.

In some embodiments, the isolation section 6 further extends to the area between the first material layers 21' of the periphery region D. That is, the first slit structure 310 further extends to the area between the first material layers 21' of the periphery region D to further improve isolation effect of the periphery region D.

The semiconductor device provided in an embodiment of the present application provides a gate line slit structure extending along the first direction that includes a first slit structure in the periphery region and a second slit structure in the core region, wherein the width of the first slit structure along the second direction is greater than the width of the second slit structure along the second direction, such that the periphery region constitutes an isolation section for separating memory blocks. No homocentric rectangular gate line slit is needed, which improves the structural stability of the semiconductor device. No H-cut is needed, which reduces the fabrication difficulty. Additionally, the gate line slit structure may further include a third slit structure in the transition region and a fourth slit structure in the staircase region, and the width of the third slit structure along the second direction is greater than the width of the second slit structure and the fourth slit structure along the second direction, which realizes separation between the second slit structure and the fourth slit structure, thereby shortening the size of the transition region G along the first direction A and reducing the volume of the semiconductor device.

Figure 9:
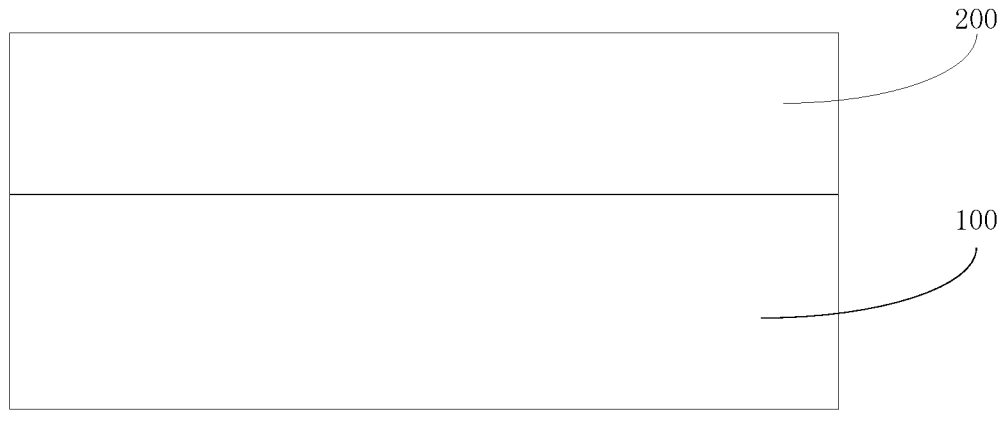
FIG. 9 is a structural diagram of a memory provided in an embodiment of the present application.

Referring to FIG. 9, it is a structure diagram of the memory provided in an embodiment of the present application.

As shown in FIG. 9, the memory includes a memory array of 100 and peripheral devices 200 connected with the memory array 100. The memory array 100 may include any of the semiconductor devices in the embodiments described above, whose details will not be repeated here.

The memory array 100 may be a non-volatile memory array. For example, the memory array 100 may be an NAND flash, an NOR flash or the like. The peripheral devices 200 may include complementary metal oxide semiconductor (CMOS), static random access memories (SRAMs), dynamic random access memories (DRAMs), field programmable gate arrays (FPGAs), a central processor (CPU), Xpoint chips or any other devices.

Specifically, the peripheral devices 200 may be located on and bonded with the memory array 100. The memory array 100 and the peripheral devices 200 may take the form of any other architecture, for example, the peripheral devices 200 may be located under the memory array 100, forming a periphery under core array (PUC) architecture, or alternatively, the peripheral devices 200 and the memory array 100 may be arranged side by side, forming a periphery near core (PNC) array architecture. No limitation is placed on this aspect.

The memory provided in embodiments of the present application can improve the structural stability of the memory and reduce the volume of the memory.

Figure 10:
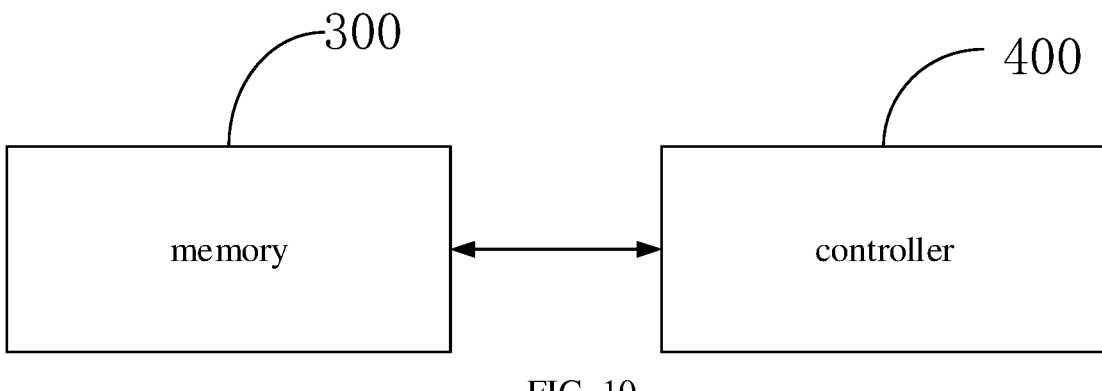
FIG. 10 is a structural diagram of a memory system provided in an embodiment of the present application.

Referring to FIG. 10, it is a structure diagram of the memory system provided in an embodiment of the present application.

As shown in FIG. 10, an embodiment of the present application further provides a memory system including a memory 300 and a controller 400. The memory 300 and the controller 400 are electrically connected, and the controller 400 is configured to control the memory 300 to store data. The memory 300 is the memory in the above-described embodiments and will not be described in detail herein. The controller 400 may be a controller known by those skilled in the art and will not be described in detail here.

The above-described memory system may be used in computers, TVs, set-top boxes, and on-vehicle terminal products.

In summary, the present application has been disclosed above with reference to some embodiments. However, the embodiments above are not used to limit the present disclosure. On the contrary, variations and modifications may be made by those of ordinary skills in the art without departing from the spirit and scope of the present application, which has a scope only defined by the claims.

What is claimed is:

1. A semiconductor device, comprising:
a stack structure comprising first material layers and second material layers stacked alternatively, wherein the stack structure comprises a core region and a periphery region distributed along a first direction; and
a gate line slit structure penetrating the stack structure and extending along the first direction, wherein the gate line slit structure comprises a first slit structure and a second slit structure connected with each other, the periphery region comprises the first slit structure, the core region comprises the second slit structure, a width of the first slit structure along a second direction is greater than a width of the second slit structure along the second direction, and the second direction intersects with the first direction; and
wherein the first slit structure comprises an isolation section, and the second slit structure comprises a conductive layer and a spacer layer disposed around the conductive layer.

2. The semiconductor device of claim 1, wherein the stack structure further comprises a transition region located on a side of the core region away from the periphery region along the first direction;
the gate line slit structure further comprises a third slit structure connected with the second slit structure, the transition region comprises the third slit structure; and
a width of the third slit structure along the second direction is greater than a width of the second slit structure along the second direction.

3. The semiconductor device of claim 2, wherein the third slit structure comprises the isolation section.

4. The semiconductor device of claim 2, wherein a length of the first slit structure along the first direction is greater than a length of the third slit structure along the first direction.

5. The semiconductor device of claim 2, wherein the stack structure further comprises a staircase region located on a side of the transition region away from the core region along the first direction;

the gate line slit structure further comprises a fourth slit structure connected with the third slit structure, the staircase region comprises the fourth slit structure; and a width of the third slit structure along the second direction is greater than a width of the fourth slit structure along the second direction.

6. The semiconductor device of claim 3, wherein the isolation section further extends to area between the first material layers of the periphery region and the transition region.

7. The semiconductor device of claim 1, wherein the stack structure further comprises a transition region located on a side of the core region away from the periphery region along the first direction, and a staircase region located on a side of the transition region away from the core region along the first direction; and the second slit structure extends to the transition region and the staircase region.

8. A memory, comprising:

a memory array comprising a semiconductor device comprising:

a stack structure comprising first material layers and second material layers stacked alternatively, wherein the stack structure comprises a core region and a periphery region distributed along a first direction; and a gate line slit structure penetrating the stack structure and extending along the first direction, wherein the gate line slit structure comprises a first slit structure and a second slit structure connected with each other, the periphery region comprises the first slit structure, the core region comprises the second slit structure, a width of the first slit structure along a second direction is greater than a width of the second slit structure along the second direction, and the second direction intersects with the first direction; and a peripheral device bonded with the memory array; and wherein the first slit structure comprises an isolation section, and the second slit structure comprises a conductive layer and a spacer layer disposed around the conductive layer.

9. The memory of claim 8, wherein the stack structure further comprises a transition region located on a side of the core region away from the periphery region along the first direction;

the gate line slit structure further comprises a third slit structure connected with the second slit structure, the transition region comprises the third slit structure; and a width of the third slit structure along the second direction is greater than a width of the second slit structure along the second direction.

10. The memory of claim 9, wherein the third slit structure comprises the isolation section.

11. The memory of claim 9, wherein a length of the first slit structure along the first direction is greater than a length of the third slit structure along the first direction.

12. The memory of claim 9, wherein the stack structure further comprises a staircase region located on a side of the transition region away from the core region along the first direction;

the gate line slit structure further comprises a fourth slit structure connected with the third slit structure, the staircase region comprises the fourth slit structure; and a width of the third slit structure along the second direction is greater than a width of the fourth slit structure along the second direction.

13. The memory of claim 12, wherein the fourth slit structure comprises the conductive layer and the spacer layer.

14. The memory of claim 10, wherein the isolation section further extends to area between the first material layers of the periphery region and the transition region.

15. The memory of claim 8, wherein the stack structure further comprises a transition region located on a side of the core region away from the periphery region along the first direction, and a staircase region located on a side of the transition region away from the core region along the first direction; and the second slit structure extends to the transition region and the staircase region.

16. The memory of claim 15, wherein the second material layers comprise gate layers and interlayer sacrifice layers, the gate layers are located in the core region, the transition region and the staircase region, and the interlayer sacrifice layers are located in the staircase region and the periphery region.

17. The semiconductor device of claim 1, wherein the isolation section comprises silicon oxide.

18. The semiconductor device of claim 5, wherein the fourth slit structure comprises the conductive layer and the spacer layer.

19. The semiconductor device of claim 7, wherein the second material layers comprise gate layers and interlayer sacrifice layers, the gate layers are located in the core region, the transition region and the staircase region, and the interlayer sacrifice layers are located in the staircase region and the periphery region.

\* \* \* \* \*